(12) United States Patent
Montagne

(10) Patent No.: US 9,819,140 B2
(45) Date of Patent: Nov. 14, 2017

(54) UNSTABLE LASER CAVITY WITH PASSIVE Q-SWITCH FITTED WITH A SATURABLE ABSORBER WITH ABSORPTION GRADIENT

(71) Applicant: COMPAGNIE INDUSTRIELLE DES LASERS CILAS, Orelans (FR)

(72) Inventor: Jean-Eucher Montagne, Orleans (FR)

(73) Assignee: COMPAGNIE INDUSTRIELLE DES LASERS CILAS, Orleans (FR)

( * ) Notice: Subject to any disclaimer, the term of this patent is extended or adjusted under 35 U.S.C. 154(b) by 0 days.

(21) Appl. No.: 14/671,837

(22) Filed: Mar. 27, 2015

(65) Prior Publication Data

US 2015/0280392 A1  Oct. 1, 2015

(30) Foreign Application Priority Data

Mar. 27, 2014 (FR) ..................... 14 00744

(51) Int. Cl.
| | | |
|---|---|---|
| *H01S 3/11* | (2006.01) | |
| *H01S 3/16* | (2006.01) | |
| *H01S 3/0941* | (2006.01) | |
| *H01S 3/08* | (2006.01) | |
| *H01S 5/40* | (2006.01) | |
| *H01S 3/113* | (2006.01) | |
| *H01S 3/06* | (2006.01) | |
| *H01S 3/081* | (2006.01) | |

(52) U.S. Cl.
CPC .............. *H01S 3/11* (2013.01); *H01S 3/0612* (2013.01); *H01S 3/0617* (2013.01); *H01S 3/08063* (2013.01); *H01S 3/08081* (2013.01); *H01S 3/0941* (2013.01); *H01S 3/113* (2013.01); *H01S 3/1611* (2013.01); *H01S 3/1623* (2013.01); *H01S 3/1643* (2013.01); *H01S 5/4025* (2013.01); *H01S 3/0818* (2013.01)

(58) Field of Classification Search
CPC ........ H01S 3/11; H01S 3/1643; H01S 3/1611; H01S 3/0941; H01S 3/1623; H01S 3/08081; H01S 5/4025; H01S 3/0617; H01S 3/08063; H01S 3/113; H01S 3/0625; H01S 3/0818
See application file for complete search history.

(56) References Cited

U.S. PATENT DOCUMENTS

| 5,388,114 A | 2/1995 | Zarrabi | |
|---|---|---|---|
| 5,390,211 A * | 2/1995 | Clark | ........................ G02F 1/39 |
| | | | 359/328 |
| 2002/0162360 A1* | 11/2002 | Schaffer | .............. C03C 23/0025 |
| | | | 65/392 |

(Continued)

FOREIGN PATENT DOCUMENTS

CA    1 164 990 A1    4/1984

OTHER PUBLICATIONS

French Search Report for FR 1400744 dated Dec. 12, 2014.

*Primary Examiner* — Xinning Niu
(74) *Attorney, Agent, or Firm* — Koppel, Patrick, Heybl & Philpott

(57) ABSTRACT

The laser cavity is of the unstable type and is provided with a passive Q-switch, the passive Q-switch comprising a saturable absorber that has an absorption gradient, so that the absorption profile of the saturable absorber is inhomogeneous over the cross section of the beam travelling in the laser cavity.

11 Claims, 2 Drawing Sheets

(56) References Cited

U.S. PATENT DOCUMENTS

| | | | |
|---|---|---|---|
| 2003/0161375 A1* | 8/2003 | Filgas | B23K 26/0648 |
| | | | 372/66 |
| 2004/0119552 A1* | 6/2004 | Wray | H01P 1/26 |
| | | | 333/22 R |
| 2004/0218653 A1* | 11/2004 | Arbore | H01S 3/06708 |
| | | | 372/70 |
| 2007/0068475 A1* | 3/2007 | Kopecek | F02P 23/04 |
| | | | 123/143 B |
| 2009/0016385 A1 | 1/2009 | Sakai | |
| 2010/0309936 A1* | 12/2010 | Lefort | H01S 3/113 |
| | | | 372/11 |
| 2012/0039345 A1* | 2/2012 | Fan | H01S 3/1118 |
| | | | 372/18 |

* cited by examiner

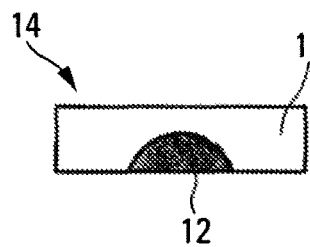
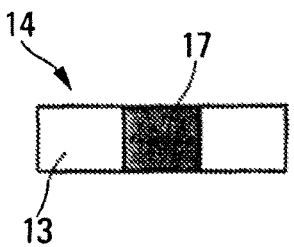
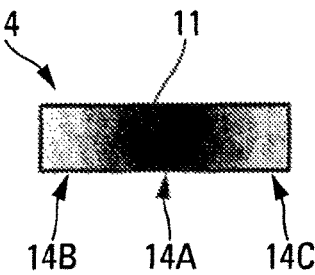
Fig. 4A Fig. 4B Fig. 4C
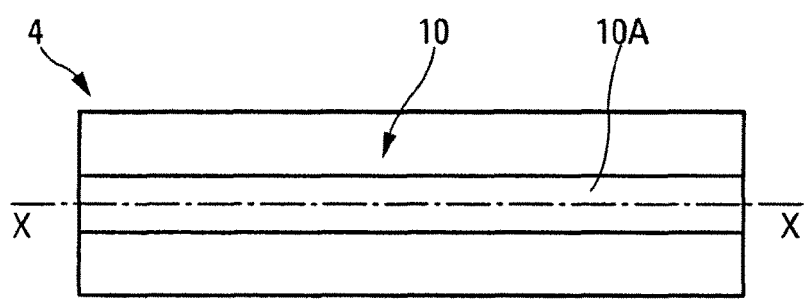
Fig. 5
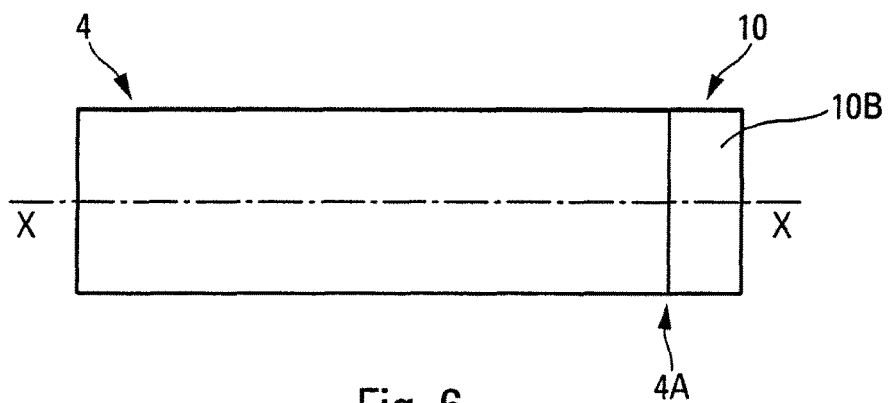
Fig. 6

UNSTABLE LASER CAVITY WITH PASSIVE Q-SWITCH FITTED WITH A SATURABLE ABSORBER WITH ABSORPTION GRADIENT

The present invention relates to an unstable laser cavity of the passive Q-switch type, and a laser source fitted with such a laser cavity.

It is known that the function of a laser cavity is to generate and extract laser radiation and for this purpose comprises in particular:
- mirrors facing each other so as to delimit said laser cavity; and
- at least one active element (or laser amplifier) that is arranged between these mirrors and is able to absorb a pumping beam to amplify a laser beam propagating along a propagation axis.

It is also known that lasers fitted with laser cavities functioning in Q-switched mode are capable of delivering short light pulses, generally in the range from one to a few tens of nanoseconds, and with a high power peak, normally greater than one megawatt. There are many applications of this type of laser, both in the civil field (scientific lasers (tunable-laser pumping for example), etching, marking, etc.) and in the military field (marking, telemetry, etc.). In the majority of cases, these lasers are Q-switched either actively by an electro-optical or acousto-optical device (active Q-switch) or passively by a saturable absorption component (passive Q-switch).

Active Q-switches have several advantages compared with passive Q-switches: control of the moment of Q-switching (better than one nanosecond), low temporal jitter, and higher extraction efficiency. On the other hand, these active Q-switches require electronics which, without being sophisticated, add complexity, size, weight and cost to the Q-switch.

The present invention relates to an unstable laser cavity that remedies these drawbacks.

For this purpose, according to the invention, the unstable laser cavity fitted with a passive Q-switch is wherein the passive Q-switch comprises a saturable absorber that has an absorption gradient, that is to say the absorption profile of which is inhomogeneous over the cross section of beam travelling through the laser cavity.

Thus, by virtue of the use of a saturable absorber the absorption profile of which is inhomogeneous over the cross section, it is possible to provide an absorption profile that is such that the residual absorption is almost zero over a portion of the cross section where most of the energy is extracted, that is to say generally on the edges of the pumped active element. The combination of an unstable cavity, where the extraction of the energy is generally carried out by diffraction on the periphery of a coupling mirror, with such a saturable-absorbent passive Q-switch with absorption gradient (for which residual absorption is almost zero), leads to an efficiency close to that provided by an unstable cavity comprising an active Q-switch, without having the drawbacks of such an active Q-switch: complexity, size, weight and cost.

Thus, in the case where temporal jitter is not a critical element, there is thus available a laser cavity making it possible to obtain an extraction efficiency close to that which is achieved with an active Q-switch.

Said laser cavity may have at least some of the following features, taken individually or in combination:
- the saturable absorber has a radial absorption gradient, preferably with greater absorption at the centre than towards the radial ends;
- the passive Q-switch is doped in a doping gradient creating the absorption gradient;
- the passive Q-switch comprises a part doped homogeneously and having variable thickness creating the absorption gradient; and
- the laser cavity is of the confocal type.

In a particular embodiment, the passive Q-switch is integrated in an active medium, in particular a laser bar, of the laser cavity. Advantageously, in a first variant, said active medium is of the ceramic type and comprises a part constituting the passive Q-switch and, in a second variant, the active medium comprises, in addition to a main doping intended for laser emission, secondary doping having a doping gradient and creating the passive Q-switch.

In this particular embodiment, advantageously, the passive Q-switch is arranged at a downstream longitudinal end of the active medium or longitudinally in the elongate active medium (then being centred on the longitudinal axis of the active medium).

The present invention also relates to a laser source comprising at least:
- a laser cavity comprising at least one active element (or active medium);
- a pumping system for emitting at least one pumping beam; and
- an optical transport system for directing the pumping beam towards the active element (or active medium) of the laser cavity.

According to the invention, said laser source comprises at least one unstable laser cavity fitted with a passive Q-switch (with a saturable absorber having an absorption gradient) as aforementioned.

The figures of the accompanying drawing will give a clear understanding as to how the invention can be implemented. In these figures, identical references designate similar elements.

FIG. 4A to 4C present various embodiments of a saturable absorber with an absorption gradient.

FIGS. 5 and 6 show an active medium of a laser source integrating a saturable-absorbent passive Q-switch with an absorption gradient, respectively in two different embodiments.

Figure 1:
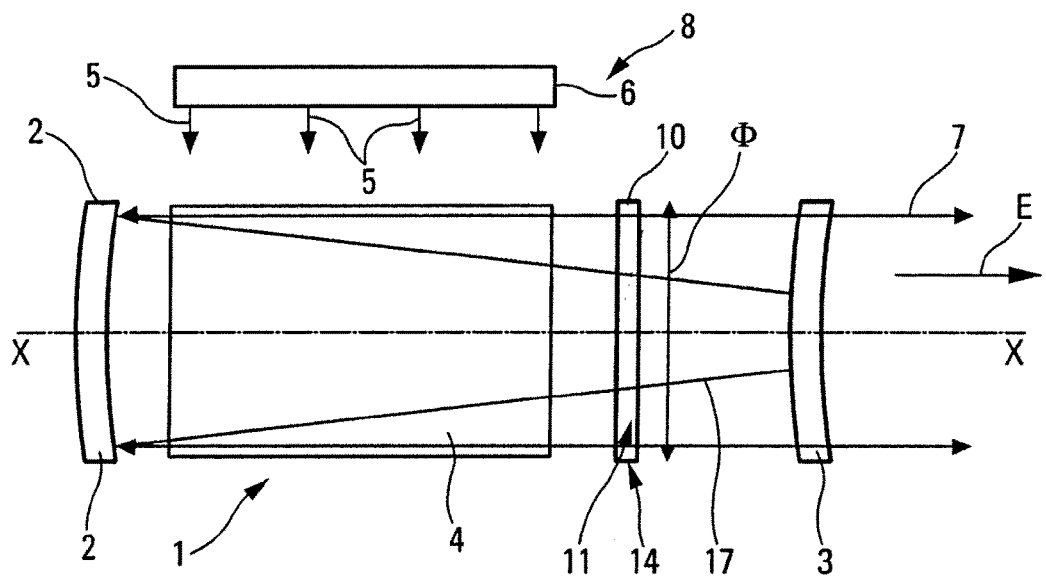
FIG. 1 is a schematic view of a laser cavity according to an embodiment of the invention.

The laser cavity 1 showing one embodiment of the invention and shown schematically in FIG. 1 comprises, in the usual fashion:
- mirrors 2 and 3 that face each other and delimit this laser cavity 1; and
- a cylindrical active medium 4 (for example a laser bar), elongate along an axis X-X.

This active medium 4 is an amplifying element (or active element) and comprises a doped material able to absorb a pumping beam (illustrated by arrows 5) emitted by a pumping system 6 to amplify a corresponding laser beam 7 that is extracted from the laser cavity 1 (of axis X-X).

This laser cavity 1 is of the unstable type. Usually, in an unstable laser cavity, a light beam 17 travelling in the cavity moves away from the optical axis (axis X-X), as it propagates, as shown in FIG. 1. A portion of the beam 17 travelling in the cavity 1, generally the radially external portion with respect to the optical axis X-X, is transmitted out of the cavity 1 by an optical element (mirror 3) provided for this purpose in order to form the extracted or useful laser beam 7.

The laser cavity 1 (or optical cavity) shown schematically in FIG. 1 is intended to be used in a laser source 8.

Such a laser source 8 comprises, in the usual fashion, in addition to said laser cavity 1, in particular:
the pumping system 6, which comprises usual means, for example pumping diodes (not shown), able to emit at least one pumping beam 5; and
a normal optical transport system (not shown), which is intended to direct the pumping beam 5 emitted by the pumping system 6 in said laser cavity 1, so as to effect the pumping of the active medium 4.

The laser cavity 1 confers on the laser beam 7, which is extracted as specified below, its directivity (arrow E) and geometry characteristics.

In addition, said laser cavity 1 of the unstable type functions in Q-switched mode and is fitted for this purpose with a passive Q-switch 10.

According to the invention, the passive Q-switch 10 comprises a saturable absorber 11 that has an absorption gradient. This means that the saturable absorber 11 of the passive Q-switch 10 has inhomogeneous absorption characteristics, that is to say comprising an absorption profile that is not homogeneous, over the cross section (transversely to the axis X-X) of the beam travelling in the laser cavity 1. The absorption therefore varies according to the location on the cross section.

In a preferred embodiment, the saturable absorber 11 has a radial absorption gradient, preferably with greater absorption at the centre (at the axis X-X) than at the radial ends.

Within the scope of the present invention, the adjective radial is defined with respect to the axis X-X, transversely to the latter.

Usually a saturable absorber is an absorbent the absorption coefficient of which can vary reversibly under the effect of a sufficiently intense light flow of given frequency. The functioning of a saturable absorber is based on the non-linear transparency optical effect caused optically: a medium opaque in the initial state becomes transparent when the radiation to which it is subjected becomes sufficiently intense. To Q-switch a laser source by saturable absorption, the material used for the saturable absorber 11 must have absorption at the wavelength emitted by the laser source, and the coefficient of absorption at this wavelength must decrease under the effect of sufficiently intense radiation at this wavelength.

In the embodiment shown in FIG. 1, the unstable laser cavity 1 is confocal with a positive branch with a coupling mirror 3 of the super-Gaussian type (that is to say that has variable reflectivity the reflectivity curve of which is super-Gaussian), so that the output laser beam 7 is collimated.

The passive Q-switch 10 with absorption gradient is placed just before the coupling mirror 3 in the direction E (defined by the direction of extraction of the laser beam 7) and its absorption maximum is centred on the axis X-X of the laser cavity 1.

Thus, by means of the use of a saturable absorber 11 the absorption profile of which is inhomogeneous over the cross section, it is possible to provide an absorption profile that is such that the residual absorption is almost zero over a cross-section portion where most of the energy is extracted, that is to say generally on the edges of the coupling mirror 3. The combination of an unstable laser cavity 1, where the extraction of the energy is generally performed by diffraction on the periphery of the coupling mirror 3, in such a saturable-absorbent passive Q-switch 10 with absorption gradient (for which the residual absorption is almost zero), leads to an efficiency close to that provided by an unstable cavity 1 with an active Q-switch, without having the drawbacks of such an active Q-switch.

By virtue of the unstable laser cavity 1, the extraction of the energy stored in the whole of the pump volume takes place with optimum efficiency while guaranteeing excellent discrimination of the fundamental mode with respect to the higher-order modes.

In a first particular embodiment, in order to obtain the absorption gradient of the passive Q-switch 10, the saturable absorber 11 of said passive Q-switch 10 is doped in an inhomogeneous fashion, that is to say with a variable doping concentration. The passive Q-switch 10 is doped at a doping gradient creating the absorption gradient, preferably with a radial doping decreasing from the centre (at the axis X-X) towards the radial ends.

Figure 2:
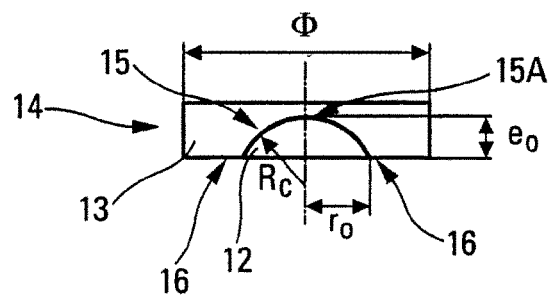
FIG. 2 is a diagram showing features of a particular absorbent lens (or slug) of a passive Q-switch.

In a second particular embodiment, in order to obtain the absorption gradient of the passive Q-switch 10, the saturable absorber (doped homogeneously) has an absorption variation that is generated by a radial variation in its thickness. The saturable absorber is thus physically equivalent to a plano-convex convergent lens 12, as shown in FIG. 2. For this lens 12 not to have an appreciable effect on the stability of the laser cavity 1, it is embedded in a medium 13 with the same index in order to form a blade 14 with parallel faces. Such a configuration makes it possible to control several sizing parameters, such as the size of the absorbent lens and the influence of its shape. Depending on the radius of curvature of the absorbent lens 12 and its diameter, it is possible to obtain various elements shown schematically in FIG. 3A to 3D.

In the example in FIG. 2, the absorbent lens (or slug) 12 does not occupy the entire opening. Provision is made for its shape to be reduced to a spherical cap 15 (no protrusion under the flat face of the lens). The absorption therefore falls to zero at the periphery 16 of the lens 12.

The thickness e of the spherical cap 15 (or lens 12) through which the light passes, according to the radial position r (with respect to the axis X-X), is given by the following expression:

$$e = e_0 - f(r) = e_0 - (R_C - \sqrt{R_C^2 - r^2}) \text{ with } r \le r_0 \text{ and } r_0 \le \phi/2$$

in which $e_0$ is the thickness at the centre (X-X) of the lens 12 and $R_C$ the radius of curvature of the convex face 15A of the spherical cap 15. The aperture diameter of the beam is $\phi$ and the radius of the lens 12 is $r_0$.

Depending on the value of the radius of curvature $R_C$ of the absorbent lens 12 and its diameter, it is possible to obtain different characteristics shown schematically in FIG. 3A to 3D. More precisely:
in the example in FIG. 3A, the radius of curvature $R_C$ is infinite and the saturable absorber 11 is homogeneous;
in the example in FIG. 3B, the absorbent lens 12 occupies the whole of the aperture $\phi$;
in the example in FIG. 3C, the absorbent lens 12 partially occupies the aperture $\phi$, as in the example in FIG. 2; and
in the example in FIG. 3C, the absorbent lens 12 is hemispherical.

The transmission $T_{fs}(r)$ of the lens 12 according to the radial position r is:

$$T_{fs}(r) = \exp(-\alpha_{fs}(e_0 - f(r))) = T_{fs0} \cdot \exp(\alpha_{fs}(R_C - \sqrt{R_C^2 - r^2}))$$

where $\alpha_{fs}$ is the coefficient of absorption of the saturable absorber forming the lens 12 and $T_{fs0}$ the transmission at the centre of the lens 12 that is given by:

$$T_{fs0} = \exp(-\alpha_{fs} \cdot e_0)$$

It is considered that this value $T_{fs0}$ is the transmission at the centre of the lens 12 for a very low light intensity (weak-signal transmission). By means of this formula, the weak-signal radial transmission is calculated. In practice, the weak-signal transmission is measured directly in a configuration of given thickness $e_0$ and given concentration, which makes it possible to evaluate a weak-signal absorption coefficient:

$$\alpha_{fs} = -\mathrm{Ln}(T_{fs0})/e_0$$

When the light intensity increases significantly in the cavity 1, the absorption decreases and the ideal transmission of the saturable absorber is given by an equation of the following type:

$$T_i(r) = \exp(\mathrm{Ln}(T_{fs}(r))/(1 + I/I_{sat}))$$

in which $I_{sat}$ is the intensity of saturation of the saturable absorber.

However, a saturable absorber has a saturation transmission that is never equal to 1. Considering that the saturation residual absorption is due to the presence of absorption towards the excited states of the doping element, the saturation transmission is:

$$T_{sat} = \exp(-n_g \sigma_{exs} e)$$

where $n_g$ is the density of population on the fundament state (concentration of doping ions), $\sigma_{ex}$ is the effective cross section of absorption towards the excited states and e the thickness passed through. In practice, the saturation transmission $T_{sat0}$ is measured directly in a configuration of given thickness $e_0$ and given concentration, which make it possible to evaluate an absorption coefficient towards the excited states:

$$\alpha_{ex} = -\mathrm{Ln}(T_{sat0})/e_0$$

Consequently, in the case of an absorbent in the form of a spherical lens 15, the saturation transmission according to the radial coordinate is written:

$$T_{sat}(r) = T_{sat0} \cdot \exp\left(\frac{\mathrm{Ln}(T_{sat0})}{e_0}\left(R_C - \sqrt{R_C^2 - r^2}\right)\right)$$

Overall, a real saturable absorber has an instantaneous transmission given by the following approximate equation:

$$T(r) = T_{fs}(r) + \left(\frac{T_i(r) - T_{fs}(r)}{1 - T_{fs}(r)}\right) \cdot (T_{sat}(r) - T_{fs}(r))$$

By way of non-limiting example, the characteristics and dimensions of a particular embodiment of the laser cavity 1 are stated below, shown in FIG. 1:

A/ the active medium 4 is yttrium-aluminium garnet doped with neodymium of the Nd:YAG type, with a diameter $\phi = 0.635$ cm, length $l = 8$ cm and refractive index $n_{YAG} = 1.82$;

B/ the unstable laser cavity 1 has a geometric length $L = 10$ cm (along the axis X-X). Ignoring the thickness of the saturable absorber (by way of indication: approximately 2 mm), the effective length $L_{eff}$ of the laser cavity 1 is therefore approximately:

$$L_{eff} = \left(1 - \frac{1}{n_{YAG}}\right) \cdot L, \text{ namely } L_{eff} = 4.5 \text{ cm}.$$

The effective length $L_{eff}$ serves to define the cavity mirrors 2 and 3.

C/ defining the cavity mirrors 2 and 3 requires first of all that the enlargement of the confocal cavity 1 be determined. Great enlargement affords better discrimination compared with the high-order spatial modes, but requires high gain. In the case of a bar of the Nd:YAG type, a good compromise situates the enlargement at a value of between 1.25 and 2. In the following example, an enlargement $m = 1.5$ is chosen.

The radii of curvature $R_1$ and $R_2$ respectively of the mirrors 3 and 2 are determined from the following equations:

a) small coupling mirror 3:

$$R_1 = \left(\frac{-2L_{eff}}{m - 1}\right) = 18 \text{ cm}$$

b) large cavity-bottom concave mirror 2:

$$R_2 = \left(\frac{2mL_{eff}}{m - 1}\right) = 27 \text{ cm}$$

It is necessary to configure the variable-reflectivity coupling mirror 3 by choosing in particular its equivalent reflectivity (this parameter being able to be refined subsequently). It is known that, in a conventional stable Nd:YAG cavity the coupling mirror of which has constant reflectivity it is not necessary for the reflectivity to be greater than 0.2. The reflectivity of the coupling mirror 3 does not correspond to the optimum value, it is chosen so as to keep a margin of safety with respect to the limit of resistance to the flow of the components. This value is therefore taken as the equivalent reflectivity $R_{eq}$, which makes it possible to calculate the reflectivity at the centre of the coupling mirror 3:

$$R_0 = m^2 \cdot R_{eq} = 0.45$$

The super-Gaussian order n is determined by a flat beam condition at the exit from the cavity, that is to say without a hole or overintensity at the centre of the beam. This condition is expressed by the equation:

$$R_0 = \left(\frac{1}{m^n}\right)$$

The following is derived in the configuration in question:

$$n = \frac{-\mathrm{Ln}(R_0)}{\mathrm{Ln}(m)} = 2$$

The size of the reflective spot $\omega_m$ on the mirror 3 depends on the size of the beam that is developed in the cavity 1. It is a case of finding equilibrium between the losses by diffraction imposed by the diaphragmation of the beam by the bar 4 itself and the extraction of energy at the periphery of the coupling mirror 3. Generally, the intensity at the edge of the bar 4 is chosen between 0.2% and 13% of the intensity at the centre. A little arbitrarily, and this may be optimised, it is chosen to situate the intensity at the edge of the bar 4 at 5% of the intensity at the centre. Under these conditions, if the intensity distribution is given by the equation:

$$I(r)=I_0 \cdot \exp(-2(r/\omega^2))$$

a beam size (radius at $1/e^2$ of the intensity $I_0$ at the centre) is calculated:

$$\omega_i = 0.8165 \cdot \phi/2 = 0.26 \text{ cm}$$

The size of the reflective spot is then derived from the following equation:

$$\omega_m = \frac{\omega_i}{(m^2-1)^{1/2}} = 0.232 \text{ cm}$$

D/ the saturable absorber 11 used in the passive Q-switch 10 may be $Cr^{4+}$:YAG. The weak-signal transmission at the centre of the saturable absorber is $T_0=0.25$. This is a good compromise for extracting the required energy with the available pumping power. The saturation transmission is $T_{sat}=0.85$, which corresponds to an order of magnitude that is compatible with the weak transmission $T_0$ adopted.

Moreover, concerning the pumping system 6 and the spectroscopic parameters, to simplify the calculation, the pumping diode energy deposition (of the pumping system 6) is assumed to be uniform throughout the active medium 4 and is implemented with an optical efficiency of 75%. Pumping power of 5000 watts is available at the output of the laser diodes. The quantic fluorescence efficiency of Nd:YAG adopted is 92% and the effective stimulated emission cross section $2.7 \times 10^{-19}$ $cm^2$.

Figures 3A, 3B, 3C, 3D:
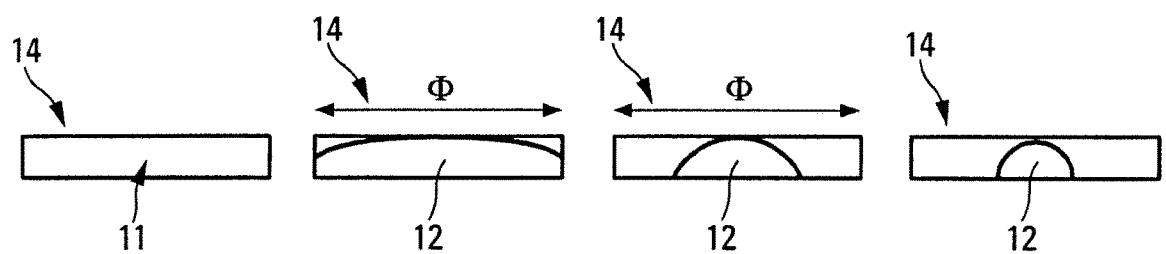
FIG. 3A to 3D show various embodiments of absorbent lenses of a passive Q-switch.

Numerical simulation can be carried out for such a laser source 8, in several successive steps E1 to E4, so as to clearly reveal the gain afforded by the introduction according to the invention of the saturable absorber with absorption gradient:

E1/ the saturable absorber is homogeneous throughout its volume (FIG. 3A). Its transmission is optimised in order to extract the maximum energy at the end of the pumping period having regard to the pumping power available;

E2/ the optimum transmission calculated at E1 is chosen as the reference transmission at the centre of the beam and will not be changed for the remainder of the calculations. The radius of curvature $R_C$ of the absorbent sphere is varied between infinity (homogeneous transmission: FIG. 3A) and a value $R_{CB}$, so as to have zero transmission at the edge of the beam, with:

$$R_{CB} = \frac{\phi^2 + e_0^2}{2e_0}$$

E3/ the radius of curvature of the sphere 12 is then decreased to a minimum value that corresponds to the thickness of the absorbent blade 14 ($e_0$: hemispherical lens), which amounts to decreasing the diameter of the absorbent zone from $\phi$ to $2e_0$ (FIG. 3C). With this method, in order to arrive at a very small absorbent diameter, a sufficiently fine blade thickness 14 and therefore a high concentration (high coefficient of absorbent) of the saturable absorber is chosen. In a concrete embodiment, the small absorbent hemisphere 12 may be replaced, for example, with a radial concentration gradient (FIG. 4C);

E4/ for the purpose of having an idea of the influence of the form of the gradient, the diameter of the absorbent lens is fixed at the value $e_0$ and the radius of curvature of the sphere is changed between infinity and the minimum value $e_0$.

By means of a numerical simulation, the following results are obtained:

A) results of step E1 (FIG. 3A): for a homogeneous saturable absorber of transmission $T_0=0.25$, the energy emitted is 103 mJ;

B) results of step E2 (FIG. 3B): the saturable absorber occupies the whole of the diameter of the bar 4, but its transmission varies from the centre to the edge according to the radius of curvature of the doped lens 12. It turns out that the reduction in the thickness of absorbent on the edges of the beam improves the laser efficiency;

C) results of step E3 (FIG. 3C): the diameter of the absorbent lens varies between the diameter of the bar 4 and a diameter of 0.2 mm. For small diameters, the thickness at the centre is adapted while keeping the transmission at a constant weak signal ($T_0=0.25$). The increase in the energy emitted is high when the absorbent zone is reduced, and reaches more than 45% compared with the situation where a homogeneous absorbent is used. However, very small absorbent diameters are difficult to use. However, it turns out that a diameter of ⅓ of that of the bar 4 can be tolerated without great loss;

D) results of step E4: in the case of a lens 12 of diameter 2 mm, three different radii of curvature of the lens were tested: $R_C$ infinite, $R_C=1.25$ mm and $R_C=1$ mm. For each of these values, the emitted energy calculated is respectively 139.8 mJ, 141.8 mJ, 142.8 mJ. The effect of the form of the gradient on the energy emitted is therefore negligible.

Consequently, it turns out that:
the change from a homogeneous passive Q-switch to a Q-switch with absorption gradient affords a high gain on the energy emitted by an unstable cavity 1. The gain is around 40% in the case taken as an example;

the size of the absorbent zone does not need to be very small. Typically, there is little gain in reducing its diameter to a value of less than ⅓ of the diameter of the bar 4, that is to say approximately 2 mm in the example in question; and the form of the absorption gradient has almost zero influence on the energy emitted. It possibly has an influence of the distribution of intensity in near field in the central portion of the beam (steps E2 and E4). The external face of the absorbent element can therefore be circular, but also triangular or any other shape.

Three possible embodiments of such a saturable absorber with absorption gradient are presented below with reference to FIGS. 4A, 4B and 4C respectively.

The embodiment shown schematically in FIG. 9A consists in producing a plano-convex lens 12 of small radius of curvature from absorbent material, the thickness of which is adjusted so as to obtain the required transmission $T_0$. The (exactly) complementary part 13 is machined in a substrate of the same nature (non-absorbent medium with the same index) in order to eliminate the effects of convergence of the lens 12. The set of two components 12 and 13 is therefore of zero refractive power.

The embodiment shown schematically in FIG. 9B consists in integrating a cylindrical central portion 17 with homogeneous doping in the blade 1.

The embodiment shown schematically in FIG. 9C is the preferred embodiment. The saturable absorber 11 of the passive Q-switch is doped at a doping gradient creating the absorption gradient, in this case a radial absorption gradient, preferably with a greater absorption at the centre (at the axis X-X) than at the radial ends. This embodiment has numerous advantages. The radial absorption gradient does not have any discontinuity and the resistance to flow of the blade 14 is as good as that of a homogeneous blade. A very slight possible residual lens due to the small index gradient may be compensated for if necessary by suitable polishing of one of the faces. Several methods for manufacturing such a blade 14 can be envisaged.

In the case of a doped crystalline matrix, such as $Cr^{4+}$:YAG, production of the doping gradient can be envisaged if the material is obtained in ceramic form. In a solid crystalline material, a longitudinal doping gradient is feasible by heating by zone.

In the case of saturable absorbers with coloured centres, such as $LiF:F_2^-$, the structuring of the blade 4 can be achieved by selective irradiation of the centre. The absorption by the coloured centres being generally fairly small, the crystal is long, typically more than 20 mm.

If the bar 4 consists of ceramic, the function of saturable absorption with gradient can be integrated in the active medium 4 itself. Then a self-triggering active medium 4 is obtained.

In this particular embodiment, the passive Q-switch 10 is therefore directly integrated in the active medium 4 of the laser cavity 1, as shown in FIGS. 5 and 6.

In this particular embodiment, in a first variant embodiment, said active medium 4 is of the ceramic type and comprises a part 10A, 10B constituting the Q-switch 10. In addition, in a second variant (not shown) the active medium 4 comprises, in addition to a usual main doping intended for the laser emission, a secondary doping having a doping gradient and making it possible to create the passive Q-switch.

In this particular embodiment, the passive Q-switch 10 is:
either arranged longitudinally in the active medium 4 at its axis X-X, being centred with respect to this axis X-X, as shown in FIG. 5 for the part 10A;
or arranged at a longitudinal end 4A of the active medium 4, in this case at the downstream end in the direction E of FIG. 1, as shown in FIG. 6 for the part 10B.

The invention claimed is:

1. A laser comprising:
a coupling mirror; and
a passive Q-switch, coupled between the coupling mirror and a laser cavity, in which the laser cavity is unstable and wherein the passive Q-switch comprises a saturable absorber having a radial absorption gradient in which a center of the saturable absorber gradient has greater absorption than at a radial end of the saturable absorber, the passive Q-switch being doped in a doping gradient to create the absorption gradient, in which the absorption profile of the saturable absorber is inhomogeneous over the cross section of a beam travelling in the laser cavity and an absorption of the saturable absorber is zero at an edge of the coupling mirror.

2. The laser according to claim 1, wherein the passive Q-switch comprises a part doped homogeneously and having a variable thickness for creating the absorption gradient.

3. The laser according to claim 1, comprising at least one active medium, wherein the passive Q-switch is integrated in said active medium of the laser cavity.

4. The laser according to claim 3, wherein said active medium is of the ceramic type and comprises a part constituting the Q-switch.

5. The laser according to claim 3, wherein the active medium comprises, in addition to a main doping intended for a laser emission, a secondary doping having a doping gradient and creating the passive Q-switch.

6. The laser according to claim 3, wherein the passive Q-switch is arranged at a downstream longitudinal end of the active medium.

7. The laser according to claim 3, wherein the passive Q-switch is arranged longitudinally in the elongate active medium, while being centred on the longitudinal axis (X-X) of the active medium.

8. The laser according to claim 1, wherein the laser cavity is of the confocal type.

9. The laser according to claim 1, wherein the laser further comprises:
at least one active medium in the laser cavity;
a pumping system for emitting at least one pumping beam; and
an optical transport system for directing the pumping beam towards the active medium of said laser cavity.

10. The laser according to claim 1, wherein the laser cavity is confocal with a positive branch, and the coupling mirror is a super-Gaussian coupling mirror, such that an output laser beam is collimated.

11. The laser according to claim 1, wherein the saturable absorber is physically equivalent to a plano-convex convergent lens embedded in a medium with the same index, such that a blade with parallel faces is formed in the saturable absorber.

* * * * *